United States Patent [19]
Knight et al.

[11] Patent Number: 5,486,267
[45] Date of Patent: Jan. 23, 1996

[54] METHOD FOR APPLYING PHOTORESIST

[75] Inventors: Stephen E. Knight, Essex Junction; Stephen E. Luce, Cambridge; Thomas L. McDevitt, Underhill, all of Vt.

[73] Assignee: International Business Machines Corporation, Armonk, N.Y.

[21] Appl. No.: 202,418

[22] Filed: Feb. 28, 1994

[51] Int. Cl.$^6$ .................................................. H01L 21/00
[52] U.S. Cl. ........................ 156/659.11; 156/643.1; 156/662.1; 216/41
[58] Field of Search ............... 156/646.1, 659.11, 156/666.11, 643.1, 662.1; 216/41, 49

[56] References Cited

U.S. PATENT DOCUMENTS

| | | | |
|---|---|---|---|
| 4,491,628 | 1/1985 | Ito et al. | 430/176 |
| 4,615,763 | 10/1986 | Gelorme et al. | 156/643 |
| 4,877,482 | 10/1989 | Knapp et al. | 156/643 |
| 4,902,647 | 2/1990 | Chutjian et al. | 437/239 |
| 5,163,458 | 11/1992 | Monroe | 134/1 |
| 5,215,592 | 6/1993 | Jackson | 134/1 |
| 5,236,512 | 8/1993 | Rogers et al. | 134/1 |
| 5,268,056 | 12/1993 | Kishi et al. | 156/345 |

FOREIGN PATENT DOCUMENTS 02125449  5/1990  Japan .
05166769  7/1993  Japan .

*Primary Examiner*—R. Bruce Breneman
*Assistant Examiner*—George Goudreau
*Attorney, Agent, or Firm*—Heslin & Rothenberg

[57] ABSTRACT

The invention provides a method for substrate preparation prior to applying photoresist to the substrate. A substrate, such as a TEOS-based silicon dioxide or silicon nitride film, is selected and treated with reactive oxygen. The reactive oxygen can comprise ozone or ozone plasma, for example. After treatment of the substrate, the photoresist, preferably an acid-catalyzed photoresist for use with deep UV sensitization, is applied.

11 Claims, 1 Drawing Sheet

METHOD FOR APPLYING PHOTORESIST

TECHNICAL FIELD

This invention relates to a method for substrate preparation prior to applying photoresist, and more particularly to the treatment of a substrate film with a reactive oxygen species prior to applying an acid-catalyzed photoresist to the film.

BACKGROUND ART

Deep ultraviolet (DUV) lithography is currently available for use in the fabrication of semiconductor devices. DUV lithography utilizes deep UV light to expose photoresist. Photoresists amenable to such sensitization include acid-catalyzed photoresists. Acid-catalyzed photoresists are discussed in detail in U.S. Pat. No. 4,491,628, issued Jan. 1, 1985 to International Business Machines Corporation (the contents of which are hereby incorporated by reference). These photoresists include a photoinitiator which generates acid upon exposure to deep UV light.

The use of acid-catalyzed photoresists results in some problems that have not been encountered with previously-known resists (such as mid-UV resists, namely novolac-resin based photoresists). These problems are thought to occur due to the presence of contaminants at the resist/substrate interface which interfere with the sensitization of the resist material. The problems are manifested as profile distortion at the resist/substrate interface, taking the form of "footing" on positive resists and "undercutting" on negative resists. As a result, the ability to control patterning to critical dimensions using the resist is detrimentally affected. This limits the usefulness of acid-catalyzed photoresists, which are desirable for use with deep UV photolithography.

It is therefore desirable to provide a method for applying these acid-catalyzed photoresists to a substrate, which method is not subject to contaminant problems and patterning distortion.

DISCLOSURE OF INVENTION

It is thus an object of the subject invention to provide a method for substrate preparation prior to applying photoresist that overcomes these problems caused by contaminants at the resist/substrate interface.

Briefly described, the subject invention provides a method for substrate preparation prior to applying photoresist. A suitable substrate is selected, and treated with reactive oxygen. This treatment removes contaminants from the substrate which can interfere with sensitization of the resist material. After treatment of the substrate, the photoresist is applied.

This invention is particularly suited for use with substrates that comprise chemically vapor deposited (CVD) films of materials such as silicon dioxide (including tetraethoxysilane-based silicon dioxides) or silicon nitride. The subject invention is also particularly applicable when acid-catalyzed photoresists are being applied to such substrates.

In accordance with the subject invention, the substrate is treated with reactive oxygen species such as monatomic, diatomic, or triatomic (ozone) oxygen, and preferably with ozone. The ozone can be supplied under elevated temperature or, alternatively, the ozone can be supplied simultaneously with electromagnetic excitation (generating an ozone plasma by applying an RF excitation to the ozone).

The preferred ozone concentration is at least about 5% by weight, but the beneficial results of the treatment according to the subject invention can be obtained with ozone concentrations up to about 100% by weight.

BRIEF DESCRIPTION OF DRAWINGS

The foregoing and other objects, features and advantages of the invention will be apparent from the following more particular description of preferred embodiments of the invention as illustrated in the accompanying drawings in which.

BEST MODE FOR CARRYING OUT THE INVENTION

As described above, the broad concept of the subject invention is directed to a method for substrate preparation prior to applying photoresist to the substrate. The substrate is selected and treated with reactive oxygen prior to application of the photoresist.

In one embodiment, the method of the subject invention can be performed in an AME P5000 CVD chamber (available from Applied Materials Co., Santa Clara, Calif.). A TEOS (tetraethoxysilane) based silicon dioxide film is formed by standard chemical vapor deposition (CVD) processes in the CVD chamber. Such standard CVD processes include plasma enhanced CVD (PECVD), low pressure CVD (LPCVD), and thermal CVD (THCVD). The TEOS-based silicon dioxide film is formed by reacting TEOS and ozone in the CVD chamber, such as under the following conditions: 3900 sccm oxygen with 5% by weight ozone and 1500 sccm Helium saturated with TEOS (40° C. TEOS temperature), at 30 Torr and 400° C. Without removing the film from the chamber, the film is treated with reactive oxygen (ozone) plasma under the following conditions:

| | |
|---|---|
| Ozone Concentration | 5% by weight |
| Ozone Flow | 3900 sccm |
| Power | 400 watts |
| Time | 15 seconds |
| Temperature | 400° C. |
| Pressure | 30 Torr |

Alternatively, the film could be treated with ozone at an elevated temperature, such as under the following conditions: 15 slm of oxygen with 40% by weight ozone and 0.5 slm of nitrous oxide, at 300° C. under 1 atmosphere of pressure.

The resist in this embodiment was IBM 2311 (available from International Business Machines Corporation, Armonk, N.Y.), which is based on an acid-catalyzed de-protection reaction of tert-butoxycarbonyl oxystyrene (TBOC). The resist is applied by spin coating followed by hot plate bake, as is standard procedure in the art.

By treating the film with the reactive oxygen (ozone) prior to application of the photoresist, profile distortion at the film/photoresist interface is avoided.

Figure 1:
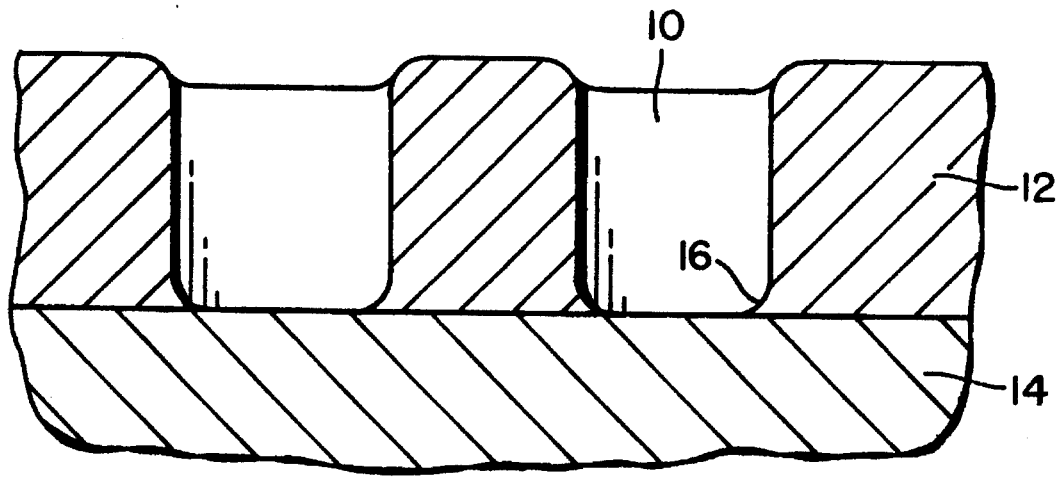
FIG. 1 is a cross-sectional view of a trench patterned in deep ultraviolet sensitive photoresist showing "footing"
Figure 2:
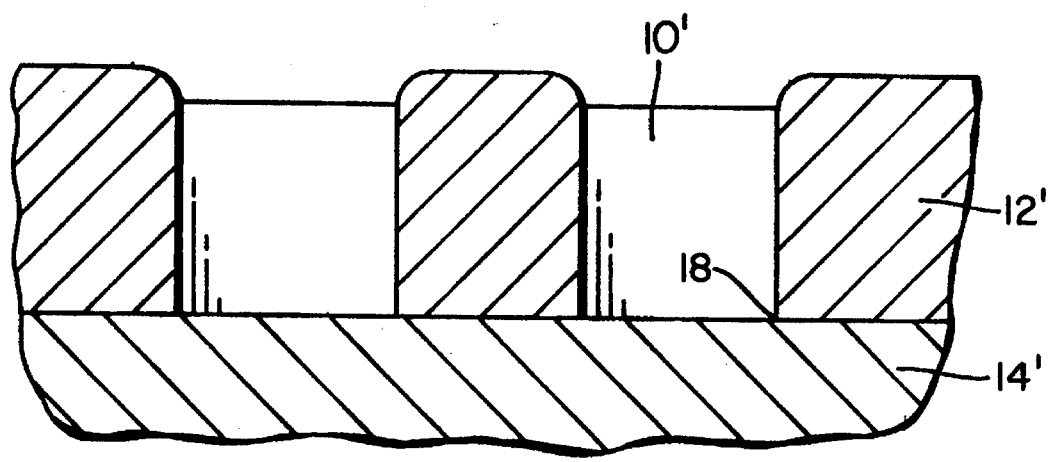
FIG. 2 is a cross-sectional view of a trench patterned in deep ultraviolet sensitive photoresist with treatment of the substrate film according to the method of the subject invention prior to resist application.

The beneficial results of the treatment according to the subject invention are best illustrated in FIGS. 1 and 2. These FIGS. 1 and 2 show the problems encountered in patterning a THCVD film for deep trench etching, and the solution provided by the subject invention. As shown, the problems were manifested in difficulty in controlling the dimensions of the trench image.

A cross sectional view of a trench 10 patterned in deep ultraviolet sensitive photoresist 12 is shown in FIG. 1. This particular structure includes 11,000 Å of an acid-catalyzed photoresist 12. Under the photoresist 12 is a 4000 Å layer of THCVD deposited silicon dioxide using TEOS reactant 14. The footing 16 that was described earlier can be seen at the bottom of the feature where the image sidewalls can be seen to encroach on the clear area.

According to the subject invention, it was found that by exposing the THCVD TEOS film to an ozone plasma prior to resist application, the footing 16 could be effectively eliminated. FIG. 2 shows a structure processed identically to that in FIG. 1 except that the sample shown in this view was subjected to a short ozone plasma step as described above. Note that the trench 10' is formed in the photoresist 12' with vertical resist profiles and sharp corners 18. This improved profile is a result of the treatment of the THCVD TEOS film 14' with the ozone plasma prior to resist application.

The advantages of the method according to the subject invention are thus readily apparent. The method herein provides for the treatment of the substrate film prior to resist application, so that contaminants on the film cannot interfere with the photoresist de-protection reaction.

While the invention has been particularly shown and described with reference to preferred embodiments thereof, it will be understood by those skilled in the art that various changes in form and details may be made therein without departing from the spirit and scope of the invention.

We claim:

1. A method for substrate preparation comprising:

providing a substrate comprising a film selected from the group of silicon dioxide and silicon nitride;

treating said substrate with ozone; then applying a resist to said treated substrate and patterning said resist over said treated substrate.

2. The method of claim 1 wherein said film comprises silicon dioxide.

3. The method of claim 1 wherein said film comprises a tetraethoxysilane-based silicon dioxide.

4. The method of claim 1 wherein said film comprises silicon nitride.

5. The method of claim 1 wherein said film is chemically vapor deposited.

6. The method of claim 1 further comprising applying electromagnetic excitation to said ozone to generate a reactive ozone plasma to treat said substrate.

7. The method of claim 1 wherein said resist comprises an acid-catalyzed resist.

8. The method of claim 1 wherein said ozone is present in a concentration from 5% by weight to 100% by weight.

9. A method for substrate preparation comprising:

selecting a substrate;

treating said substrate with one of ozone and an oxygen plasma; and applying an acid-catalyzed resist to said treated substrate.

10. The method of claim 9 wherein treating said substrate comprises treatment with an ozone plasma.

11. A method for substrate preparation comprising:

providing a substrate comprising a tetraethoxysilane-based silicon dioxide film;

treating said substrate with ozone; and applying a resist to said treated substrate.

\* \* \* \* \*